(12) United States Patent
Vigeant et al.

(10) Patent No.: US 6,285,547 B1
(45) Date of Patent: Sep. 4, 2001

(54) BRACKET FOR RETAINING COMPUTER COMPONENTS WITHIN A HOUSING

(75) Inventors: Mark Robert Vigeant; Christopher Lee Bostedt, both of Granite Bay; George Gary Giannini, Roseville, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/562,878

(22) Filed: May 1, 2000

(51) Int. Cl.[7] ....................................... H05K 7/20
(52) U.S. Cl. ................. 361/695; 361/825; 415/213.1
(58) Field of Search ........................... 454/184; 312/236; 165/80.3, 121–126; 416/244 R; 415/177, 178, 213.1; 361/687, 690, 694, 695, 719–721, 807, 809, 825

(56) References Cited

U.S. PATENT DOCUMENTS

| | | | |
|---|---|---|---|
| 3,612,173 | * | 10/1971 | Goyal . |
| 4,406,216 | * | 9/1983 | Hott . |
| 5,498,130 | * | 3/1996 | Wakely . |
| 5,562,410 | * | 10/1996 | Sachs . |
| 5,649,587 | * | 7/1997 | Plant . |
| 6,002,586 | * | 12/1999 | Chen . |
| 6,157,104 | * | 12/2000 | Yokozawa . |
| 6,164,369 | * | 12/2000 | Stoller . |

* cited by examiner

Primary Examiner—Gerald Tolin

(57) ABSTRACT

A bracket for retaining a component within a housing, where that bracket includes a front face; a first rear flange that is configured and arranged to be affixed to the housing; a second rear flange that is also configured and arranged to be affixed to the housing; a first bridging section for connecting the first rear flange to the front face; and a second bridging section for connecting the second rear flange to the front face. In addition, at least one of the first rear flange and the second rear flange is configured and arranged to maintain at least a portion of the component being retained a slight distance away from the housing. The present bracket provides a way for simply and economically installing a component, such as a fan, within a housing without requiring that the fan be directly riveted or screwed to the housing, which can cause damage to the component's cord due to the contact between the cord and the housing wall.

22 Claims, 3 Drawing Sheets

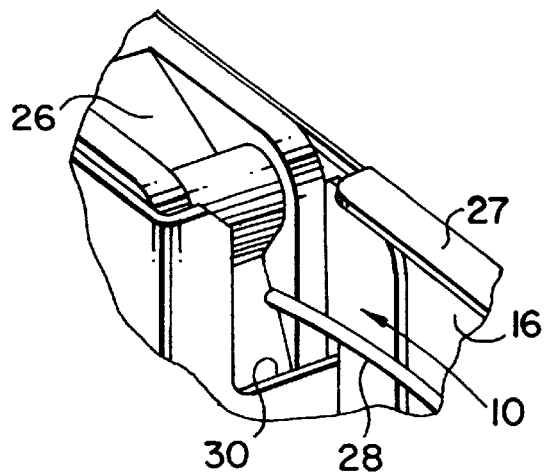
Fig. 3
Fig. 4
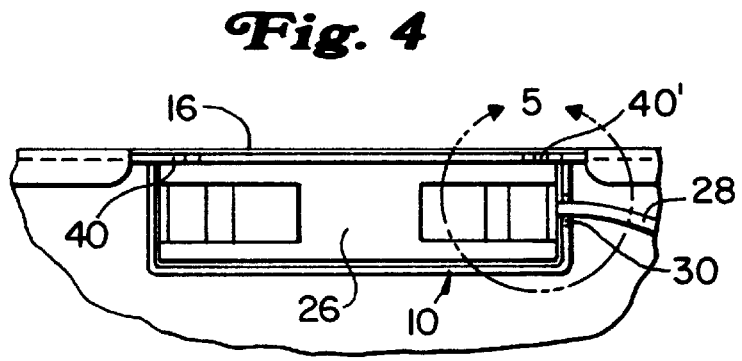
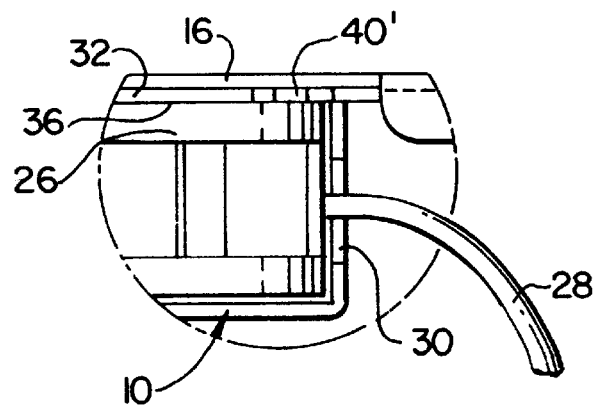
Fig. 5

BRACKET FOR RETAINING COMPUTER COMPONENTS WITHIN A HOUSING

The present invention relates generally to a bracket for retaining components within a housing, and more particularly to a bracket for retaining a corded component, such as a fan, within a housing, such as a computer housing, where that component can be easily installed within the housing without damaging the cord associated with the component.

BACKGROUND OF THE INVENTION

Within computer housings, components such as the fan used for cooling the disk drive and other parts are normally simply affixed to one of the walls of the housing with screws or rivets. However, the present inventors have determined that simply affixing the fan (or other similar corded component) to one of the walls of the housing often results in chafing of the cord, which could lead to a disruption in the current supply to the fan. Such chafing often occurs when the fan is mounted against the wall because the cord often makes sliding contact with the wall. After the fan is installed, the cord may also be maintained in contact with the wall, which could result in additional chafing during transport of the housing.

An additional problem with simply riveting or screwing the component to the wall of the housing is that installation of the component takes an unnecessary amount of time due to the fact that four screws or four rivets (one in each corner of the component) are normally used to secure the component to the wall of the housing. Moreover, if the component needs to be removed after it has been installed, such as for replacement, all of the screws or rivets need to be removed. Furthermore, if the alignment of the screw holes on the component is changed from the original configuration (which may be caused by a design change or tolerance errors), the arrangement of the screw holes on the wall need to be changed also.

Accordingly, one object of the present invention is to provide an improved bracket for retaining a component within a housing.

An additional object of the present invention is to provide an improved retention bracket in which a corded component may be installed into a housing without damaging the cord.

Another object of the present invention is to provide an improved retention bracket for securing a corded component within a housing in which the cord is separated from both the housing and the bracket so that cord chafing is reduced or eliminated.

A fourth object of the present invention is to provide an improved retention bracket for installing a fan into a computer housing in which installation is simplified when compared with attaching the fan directly to the wall of the housing.

Yet another object of the present invention is to provide an improved fan retention bracket in which the fan may be slid into the bracket, and wherein the fan is secured within the bracket without the use of screws or rivets, so that the fan may be simply slid out of the bracket if necessary.

A further object of the present invention is to provide a fan retention bracket that is of an economical design, and that provides for an inexpensive method of assembling a fan to a computer housing.

These and other objects of the present invention are disclosed or will be apparent from the following detailed description of the present invention.

BRIEF SUMMARY OF THE INVENTION

The above-listed objects are met or exceeded by the present bracket, which provides a way for simply and economically installing a component, such as a fan, within a housing without requiring that the fan be directly riveted or screwed to the housing, which can cause damage to the cord. Furthermore, the present bracket also preferably defines an air space between the component being retained and the wall of the housing so that the component's cord is not chafed during its installation and/or during transport of the housing after the component has been installed.

More specifically, the present invention provides a bracket for retaining a component within a housing, where that bracket includes a front face; a first rear flange that is configured and arranged to be affixed to the housing; a second rear flange that is also configured and arranged to be affixed to the housing; a first bridging section for connecting the first rear flange to the front face; and a second bridging section for connecting the second rear flange to the front face. In addition, at least one of the first rear flange and the second rear flange is configured and arranged to maintain at least a portion of the component being retained a slight distance away from the housing.

Additionally, the present invention also provides a fan retention assembly that includes a fan and a bracket for attaching the fan to a wall. Furthermore, the bracket includes a front face; a first rear flange affixed to the wall; a second rear flange affixed to the wall; a first bridging section for connecting the first rear flange to the front face; and a second bridging section for connecting the second rear flange to the front face. An additional feature of the present invention is that the first rear flange and the second rear flange create an air space between a rear portion of the fan and the wall. Preferably, a cutout portion is also provided in at least one of the bridging sections so that the fan's cord does not contact the bracket.

BRIEF DESCRIPTION OF THE DRAWINGS

Preferred embodiments of the present invention are described herein with reference to the drawings wherein:

FIG. 3 is an enlarged view of a portion of FIG. 2;

FIG. 4 is a top view of the retention bracket of FIG. 1, with a fan installed therein;

FIG. 5 is an enlarged view of the portion of FIG. 4 encircled within the dot-dash line 5.

DETAILED DESCRIPTION OF THE INVENTION

Figure 1:
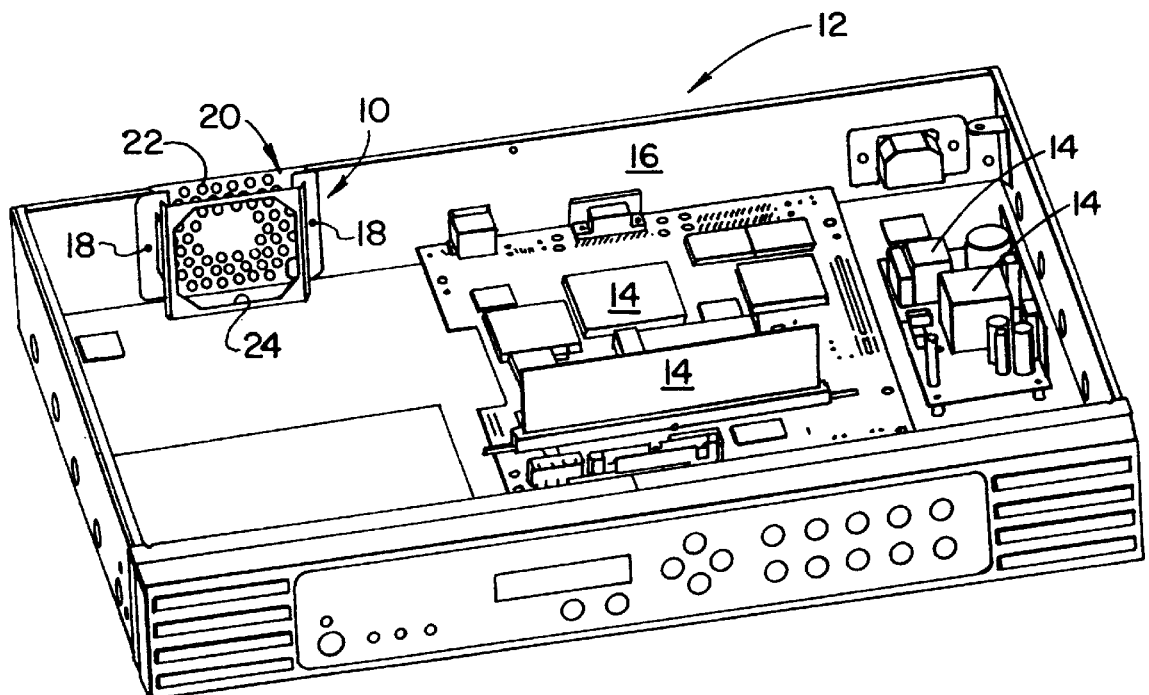
FIG. 1 is a perspective view of a computer housing including an embodiment of the retention bracket of the present invention.

Referring to FIG. 1, a preferred embodiment of the present retention bracket 10 is shown installed within a housing 12. The housing 12 may be a computer housing, such as the housing disclosed in copending U.S. patent application Ser. No. 09/562,519, entitled "Housing for Computer Components," which was filed on May 1, 2000, and which is hereby incorporated by reference. Other types of housings for other electrical component are also contemplated as being within the scope of the invention.

The example of the housing 12 shown in FIG. 1 includes a variety of computer components installed therein, and some of these computer components have been designated with the index number 14. The housing 12 also includes a wall 16, upon which the bracket 10 has been installed. While FIG. 1 shows bracket 10 as being installed upon the rear wall 16, other walls (such as the side walls, the top wall, the front wall or the bottom wall) may also be utilized if desired. Further, although the terms front, rear, top, bottom, left, right, etc. will be used throughout this specification for the sake of simplicity when referring to the drawings, these terms should not be construed as limiting the location or orientation of the present invention, except as these terms describe relative locations with respect to each other. For example, features described as being on the left and right sides of the bracket should not be construed as limiting the bracket to a single orientation, but instead should be interpreted to mean that these features are simply located on opposite sides from each other (such as on the upper side and the lower side or the front side and the rear side, etc.).

The bracket 10 is preferably affixed to the wall 16 via two screws 18, although more screws may also be used if necessary or desired. Alternatively, rivets, or any other suitable affixing means, may also be used to affix the bracket to the wall. The bracket 10 includes an open top 20, which allows for the component being retained by the bracket to be inserted downwardly. In this example, the component intended to be retained is a fan, so the bracket 10 is installed over an arrangement of air holes 22, and the front face of the bracket 10 includes an opening 24 so that hot air within the housing 12 can be exhausted via the fan.

Figure 2:
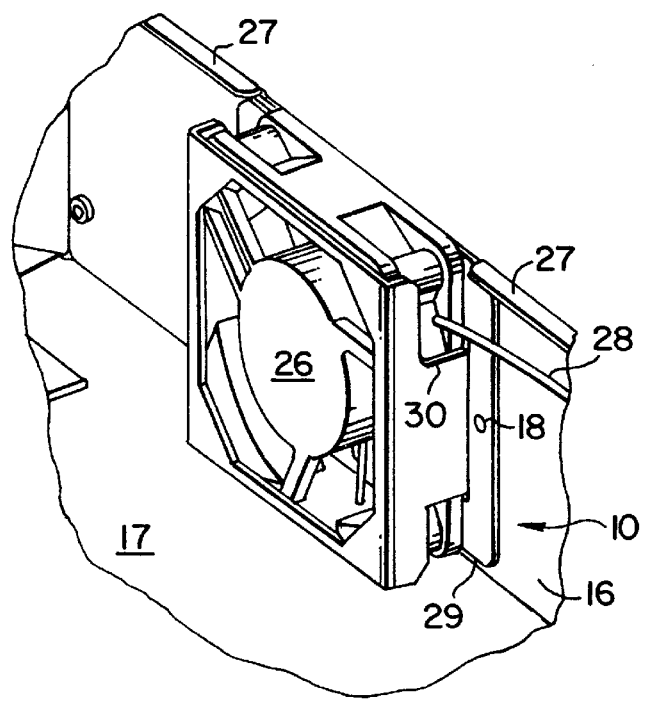
FIG. 2 is a front perspective view of the retention bracket of FIG. 1, shown with a fan installed therein.

Turning now to FIG. 2, a view is shown of the bracket 10 with a fan 26 installed therein. The wall 16 may include a lip 27 that extends along its upper surface. In accordance with the present invention, the fan 26 is inserted into the bracket 10 by sliding the fan downwardly into the open top 20 (FIG. 1) of the bracket. Preferably, the lip 27 does not extend along the area where the fan 26 needs to pass while being inserted into the bracket 10. However, the lip 27 does preferably overlap a portion of the bracket 10, as better shown in the enlarged view of FIG. 3. This overlap of the lip 27 helps to better maintain the bracket 10 in position in the vertical direction, while still allowing for unhindered insertion of the fan 26.

The lower periphery 29 of the bracket of preferably sits on or near the lower wall 17 of the housing. Configuring the bracket so that its lower periphery 29 sits directly on the lower wall 17 simplifies the vertical alignment of the bracket during installation.

After the fan 26 is inserted into the bracket 10, it is maintained in position in the vertical direction by the lower wall 17 and the upper wall (not shown) of the housing 12. The configuration of the bracket 10 keeps the fan from moving in the horizonal direction (both towards and away from the wall 16 as well as along the wall 16), as more fully described below. Accordingly, the fan need not be secured to the housing 12 with additional attachment means, such as screws or rivets, and therefore a simplified installation that only requires that the fan be slid into the bracket has been provided for by the present invention.

The fan 26 includes an electrical cord 28 that extends from one side, as better shown in the enlarged view of FIG. 3. One important feature of the present invention is that the bracket 10 includes an upper cutout portion 30 that provides an area for the cord 28 to be located where it will not contact the bracket 10. Thus, even when the fan 26 is slid downwardly into the bracket 10, the cord will not be chafed by contacting the bracket, due to the inclusion of the upper cutout portion 30. It should be noted that the upper cutout portion may configured of a different shape than that shown in the figures, as long as its shape still provides an area for the cord to be located (both during and after assembly) such that the cord does not contact the bracket.

Turning now to FIGS. 3 and 4, which are, respectively, a top view and an enlarged top view (taken within dot-dash circle 5) of the present bracket 10 with the fan 26 installed therein, a description will be provided of the manner in which the cord of the fan is maintained at a slight distance from the wall of the housing. Briefly, to separate the cord 28 from the wall 16, an air space 32 is created between the fan 26 and the wall 16. This air space 32 is created because the bracket 10 includes two rear flanges 40 and 40' (only one of which is shown in FIG. 5) that serve to separate the back wall 36 of the fan 26 from the wall 16 of the housing 12. Accordingly, the back wall 36 of the fan 26 does not sit directly on the housing wall 16. Although not shown, the cord of the fan is normally situated within a recess indented within the back wall 36 of the fan 26. Due to the presence of the air space 32, the portion of the cord that is situated within the fan's recess is maintained a slight distance away from the housing wall 16 so that the cord cannot be chafed by rubbing against the wall during installation of the fan. Nor should the cord be chafed when the entire assembly, with the fan installed, is moved to another location.

Turning now to FIGS. 6–9, the details of a preferred embodiment of the present bracket 10 will be described. The present bracket 10 is preferably made from sheet metal, and is preferably cut and folded from a single sheet of metal (although other production methods are also contemplated). Additionally, other materials, such as plastic, may also be used to manufacture the present bracket if desired.

Figure 6:
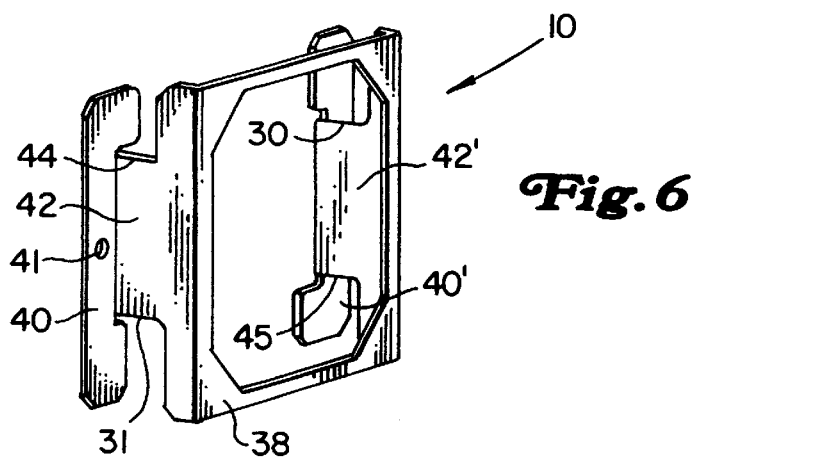
FIG. 6 is a perspective view of an embodiment of the present retention bracket.

FIG. 6 shows a perspective view of a preferred embodiment of the present retention bracket 10. This bracket 10 includes a front face 38. As mentioned earlier, the front face 38 preferably includes an opening 24 to allow air to pass therethrough if the bracket is intended for use with an exhaust device such as a fan. Extending generally parallel to the front face 38 are two rear flanges 40 and 40'. At least one aperture 41/41' for a fastening device, such as a screw or a rivet, is formed in each rear flange 40/40'. Two bridging sections 42 and 42' are used to connect the front face 38 with the rear flanges 40 and 40', respectively. These bridging sections 42 and 42' are preferably generally T-shaped, as best shown in FIGS. 7B and 7C.

As mentioned above, the bracket 10 includes an upper cutout portion 30, through which the cord 28 is intended to be fed (as shown in FIGS. 2 and 3). The upper cutout portion 30 is located on bridging section 42'. In a similar manner, a lower cutout portion 31 is also provided on the other bridging section, bridging section 42. Lower cutout portion 31 is preferably identical in shape and size to upper cutout portion 30 so that if bracket 10 is installed in a position that is upside-down to that shown in FIG. 6, the lower cutout portion 31 will then be located in a position to accept the cord 28. Due to this type of "symmetry," assembly errors resulting from possible inverted installation of the bracket 10 are eliminated.

Bridging section 42 also includes an upper cutout portion, which has been designated as upper cutout portion 44. On bridging section 42', there is a lower cutout portion 45, which is preferably identical in shape and size to the upper cutout portion 44. Once again, the identity in shape and size of these cutout portions also serves to create a bracket that may be inverted prior to assembly without affecting its effectiveness.

Figure 7B:
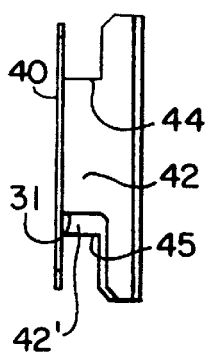
FIG. 7B is a left side view of the retention bracket of FIG. 6.
Figure 7A:
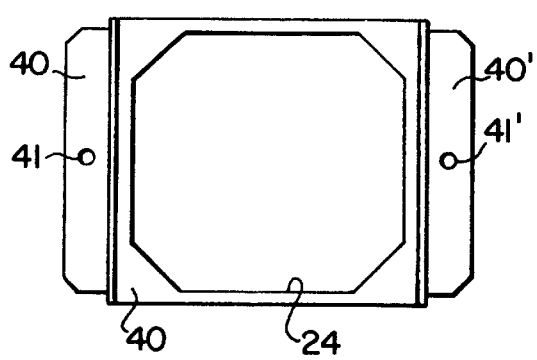
FIG. 7A is a front view of the retention bracket of FIG. 6.
Figure 7C:
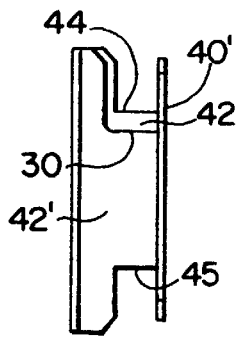
FIG. 7C is a right side view of the retention bracket of FIG. 6.

It should be noted that in the preferred embodiment, upper cutout portion 30 and lower cutout portion 31 (which are preferably identical to each other) are preferably deeper and wider than upper cutout portion 44 and lower cutout portion 45 (which are also preferably identical to each other), as can best be seen in FIGS. 7B and 7C. The deeper and wider cutout portions (30 and 31) have been provided to ensure that these cutout portions are out of contact with the cord when the fan is installed. The shallower and narrower cutout portions (44 and 45) have been provided to add additional support for the fan. However, it should be noted that all four cutout portions may be identical in size and shape, if desired, as long as the fan is provided with adequate support and the cord cannot contact the bracket.

Figure 8:
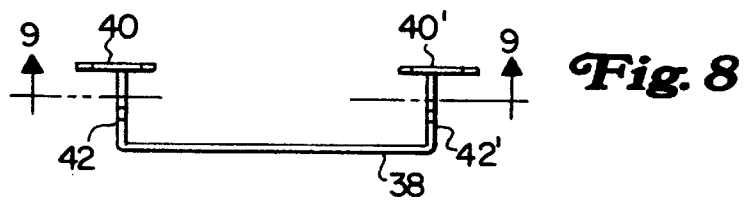
FIG. 8 is a view of the retention bracket of FIG. 6, as viewed from below and shown with the front face directed toward the bottom of the figure.
Figure 9:
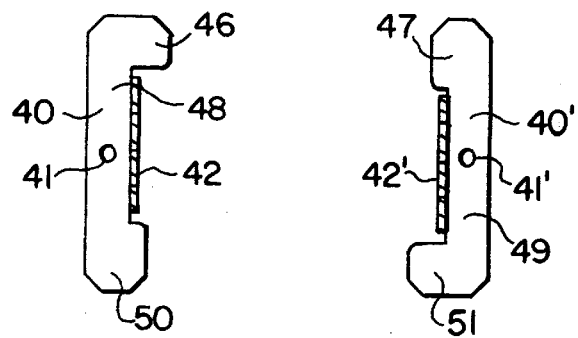
FIG. 9 is a cross-sectional view of FIG. 9, taken along line 9—9.

Turning now to FIGS. 8 and 9, more details regarding the preferred configuration of the rear flanges 40 and 40' will be provided. FIG. 8 is a depiction of the preferred embodiment of the present retainer, as viewed from the bottom and shown with its front face 38 located towards the lower portion of the figure. FIG. 9 is a cross-sectional view of the rear flanges 40 and 40', as taken from line 9—9 in FIG. 8. As can be seen in FIG. 9, rear flanges 40 and 40' are preferably generally U-shaped and are arranged such that the open areas of the U-shapes face each other.

As shown in FIG. 9, the rear flange 40 includes a generally horizontally extending upper leg 46, a generally vertically extending center leg 48, and a generally horizontally extending lower leg 50. In addition, rear flange 40' includes a generally horizontally extending upper leg 47, a generally vertically extending center leg 49, and a generally horizontally extending lower leg 51. It should be noted that the upper leg 46 preferably extends further from the center leg 40 than the lower leg 50 does (i.e., upper leg 46 is somewhat longer in the horizontal direction). In addition, the lower leg 50 is somewhat wider, in the vertical direction, than the upper leg 46. It should also be noted that the upper leg 47 (of the rear flange 40') is essentially the same size and shape as the lower leg 50 (of the rear flange 40) and that the lower leg 51 (of the rear flange 40') is essentially the same size and shape as the upper leg 46 (of rear flange 40). In a similar manner to that described above with regard to the bridging sections 42 and 42', the rear flanges 40 and 40' include this "symmetry" so that the bracket 10 may be installed upon the wall 16 with either leg 46 and leg 47 towards the top or with leg 50 and leg 51 towards the top, without affecting the operation of the bracket.

The upper leg 47 has been made with a reduced length in order to avoid making contact with the fan's cord when the fan is installed, and the lower leg 51 has been made of a longer length in order to provide additional support for the rear surface of the fan, so that the rear surface of the fan is maintained a slight distance apart from the wall of the enclosure.

Referring back to the views shown in FIGS. 4 and 5, the rear flanges 40 and 40' provide a surface upon which the rear wall 36 of the fan 26 may slide along when the fan is being installed within the bracket 10. As the total surface area of the portion of the rear flanges 40/40', which contact the fan, is less than the surface area of the portion of the wall 16 that would contact the fan in the absence of the rear flanges 40/40', the flanges help to reduce the friction that the fan would otherwise encounter if the bracket were designed without the flanges. Thus, in addition to defining an air space 32, the flanges 40/40' also serve to facilitate the sliding of the fan (or other component) into the retention bracket 10.

While various embodiments of the present invention have been shown and described, it should be understood that other modifications, substitutions and alternatives may be apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A bracket for retaining a component within a housing, said bracket comprising:
   a front face;
   a first rear flange affixed to a first portion of the housing;
   a second rear flange affixed to a second portion of the housing;
   a first bridging section connecting said first rear flange to said front face; and
   a second bridging section connecting said second rear flange to said front face;
   wherein at least one of said first rear flange and said second rear flange is positioned between the first or second housing portion and the component being retained, such that the component being retained is maintained at least a slight distance away from the housing.

2. The bracket according to claim 1, further comprising a cutout portion in at least one of said first bridging section and said second bridging section, said cutout portion being open at the top thereof.

3. The bracket according to claim 1, further comprising:
   a first cutout portion in said first bridging section; and
   a second cutout portion in said second bridging section.

4. A bracket for retaining a component within a housing, said bracket comprising:
   a front face;
   a first rear flange configured and arranged to be affixed to the housing;
   a second rear flange configured and arranged to be affixed to the housing;
   a first bridging section connecting said first rear flange to said front face,
   wherein said first bridging section is generally T-shaped, and defines a first upper cutout portion and a first lower cutout portion; and
   a second bridging section connecting said second rear flange to said front face, wherein said second bridging section is also generally T-shaped, and defines a second upper cutout portion and a second lower cutout portion;
   wherein at least one of said first rear flange and said second rear flange is configured and arranged to maintain at least a portion of the component being retained a slight distance away from the housing.

5. The bracket according to claim 4, wherein:
   said first upper cutout portion is approximately the same size as said second lower cutout portion; and
   said first lower cutout portion is approximately the same size as said second upper cutout portion.

6. A bracket for retaining a component within a housing, said bracket comprising:
a front face;
a first rear flange configured and arranged to be affixed to the housing, said first rear flange being generally U-shaped;
a second rear flange configured and arranged to be affixed to the housing;
a first bridging section connecting said first rear flange to said front face; and
a second bridging section connecting said second rear flange to said front face;
wherein at least one of said first rear flange and said second rear flange is configured and arranged to maintain at least a portion of the component being retained a slight distance away from the housing.

7. The bracket according to claim 1 wherein said second rear flange is generally U-shaped.

8. The bracket according to claim 6, wherein said generally U-shaped first rear flange includes an upper leg that extends generally horizontally, a center leg that extends generally vertically, and a lower leg that extends generally horizontally, and further wherein said upper leg is generally shorter, in the vertical direction, than said lower leg.

9. The bracket according to claim 8, wherein said upper leg is generally wider, in the horizontal direction, than said lower leg.

10. The bracket according to claim 1, wherein:
said first rear flange is generally U-shaped, and includes a first upper leg that extends generally horizontally, a first center leg that extends generally vertically, and a first lower leg that extends generally horizontally, and further wherein said first upper leg is generally shorter, in the vertical direction, than said first lower leg; and
said second rear flange is generally U-shaped and includes a second upper leg that extends generally horizontally, a second center leg that extends generally vertically, and a second lower leg that extends generally horizontally, and further wherein said second upper leg is generally longer, in the vertical direction, than said second lower leg.

11. A housing for computer components comprising:
at least one wall;
a bracket retaining a component, said bracket including a first rear flange and a second rear flange, wherein said first rear flange is positioned adjacent a first portion of said wall and said second rear flange is positioned adjacent a second portion of said wall;
wherein said bracket is affixed to said wall via at least one of said first rear flange and said second rear flange, and further wherein at least a portion of at least one of said first rear flange and said second rear flange, is positioned between the associated first or second wall portions and said component being retained such that an air space is created between said component and said wall.

12. The housing according to claim 11 wherein both said first rear flange and said second rear flange create air spaces between said component and said wall.

13. The housing according to claim 11, wherein said bracket further includes:
a front face;
a first bridging section connecting said first rear flange to said front face; and
a second bridging section connecting said second rear flange to said front face.

14. A housing for computer components comprising:
at least one wall;
a bracket retaining a component, said bracket including a first rear flange and a second rear flange, wherein said bracket further includes:
a front face;
a first bridging section connecting said first rear flange to said front face; and
a second bridging section connecting :said second rear flange to said front face;
wherein said bracket is affixed to said wall via at least one of said first rear flange and said second rear flange, and further wherein at least one of said first rear flange and said second rear flange creates an air space between said component and said wall; and
further wherein said component is an electrical component with a cord extending therefrom; and
said first bridging section includes a first cutout portion that provides an area for said cord to extend through without contacting said first bridging section.

15. The housing according to claim 14, wherein said bracket is open near the top thereof such that said electrical component may be inserted downwardly with said cord being arranged within said cutout portion, but without making contact with said cutout portion.

16. The housing according to claim 11 wherein:
said bracket further includes:
a front face;
a first bridging section connecting said first rear flange to said front face, said first bridging section being generally T-shaped, and including a first upper cutout portion and a first lower cutout portion;
a second bridging section connecting said second rear flange to said front face, said second bridging section being generally T-shaped , and including a second upper cutout portion and a second lower cutout portion.

17. The housing according to claim 16, wherein:
said bracket includes and open top and an open bottom so that the component may be inserted into said bracket via said open top or said open bottom; and
further wherein said bracket is configured to be installed in the housing with said open top facing towards a first direction or with said open bottom facing towards said first direction.

18. The housing according to claim 13, wherein:
the component is retained within said bracket in the horizontal direction via a combination of said front face, said first rear flange, said second rear flange, said first bridging section, and said second bridging section; and
the component is retained within said bracket in the vertical direction via a floor of said housing and a cover of said housing.

19. The housing according to claim 18, wherein the component is retained within said bracket without the use of threaded fasteners or rivets.

20. A fan retention assembly comprising:
a fan, said fan including a cord extending from a side thereof
a bracket attaching said fan to a wall, wherein said bracket includes:
a front face;
a first rear flange affixed to the wall;
a second rear flange affixed to the wall;
a first bridging section connecting said first rear flange to said front face, said first bridging section including a first cutout portion therein; and a second bridging section connecting said second rear flange to said front face;

wherein said first rear flange and said second rear flange create an air space between a rear portion of said fan and said wall;

further wherein upon installing said fan within said bracket, said cord is arranged within said first cutout portion without making contact with said first cutout portion.

21. The fan retention assembly according to claim 20, wherein the fan is retained within said bracket in the horizontal direction via a combination of said front face, said first rear flange, said second rear flange, said first bridging section, and said second bridging section; and further wherein the fan is retained within said bracket without the use of threaded fasteners or rivets.

22. The fan retention assembly according to claim 20 wherein said front face of said bracket includes an opening therein for allowing airflow from said fan through said bracket.

* * * * *

UNITED STATES PATENT AND TRADEMARK OFFICE
CERTIFICATE OF CORRECTION

PATENT NO. : 6,285,547 B1  
DATED : September 4, 2001  
INVENTOR(S) : Mark Robert Vigeant et al.

It is certified that error appears in the above-identified patent and that said Letters Patent is hereby corrected as shown below:

Column 6,
Line 18, after "bracket" delete "for"

Signed and Sealed this

Twenty-sixth Day of July, 2005

JON W. DUDAS
*Director of the United States Patent and Trademark Office*